United States Patent
Khlat (10) Patent No.: US 11,424,719 B2
(45) Date of Patent: Aug. 23, 2022

(54) MULTI-BANDWIDTH ENVELOPE TRACKING INTEGRATED CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 74 days.

(21) Appl. No.: 16/597,952

(22) Filed: Oct. 10, 2019

(65) Prior Publication Data

US 2020/0336111 A1 Oct. 22, 2020

Related U.S. Application Data

(60) Provisional application No. 62/835,798, filed on Apr. 18, 2019.

(51) Int. Cl.
*H03F 3/04* (2006.01)
*H03F 1/02* (2006.01)
(Continued)

(52) U.S. Cl.
CPC ........... *H03F 1/0233* (2013.01); *H03F 3/213* (2013.01); *H04L 27/2601* (2013.01);
(Continued)

(58) Field of Classification Search
CPC .. H03F 1/0233; H03F 3/213; H03F 2200/129; H03F 2200/375;
(Continued)

(56) References Cited

U.S. PATENT DOCUMENTS 5,510,753 A 4/1996 French
5,838,732 A 11/1998 Carney
(Continued)

FOREIGN PATENT DOCUMENTS

EP 3174199 A2 5/2017
JP H03104422 A 5/1991
(Continued)

OTHER PUBLICATIONS

Non-Final Office Action for U.S. Appl. No. 16/122,611, dated Mar. 11, 2020, 16 pages.
(Continued)

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

A multi-bandwidth envelope tracking (ET) integrated circuit (IC) (ETIC) is provided. The multi-bandwidth ETIC may be coupled to an amplifier circuit(s) for amplifying a radio frequency (RF) signal modulated in a wide range of modulation bandwidth. In examples discussed herein, the multi-bandwidth ETIC includes an ET voltage circuit configured to generate a modulated voltage based on a supply voltage. The supply voltage may be dynamically adjusted to cause the modulated voltage to transition quickly from one voltage level to another voltage level, particularly when the RF signal is modulated in a higher modulation bandwidth, without compromising efficiency of the ET voltage circuit. As such, the multi-bandwidth ETIC may generate different modulated voltages based on the modulation bandwidth of the RF signal, thus making it possible to employ the multi-bandwidth ETIC in a wide range of wireless communication devices, such as a fifth-generation (5G) wireless communication device.

19 Claims, 6 Drawing Sheets

(51) Int. Cl.
*H03F 3/213* (2006.01)
*H04L 27/26* (2006.01)

(52) U.S. Cl.
CPC .. *H03F 2200/102* (2013.01); *H03F 2200/111* (2013.01); *H03F 2200/129* (2013.01); *H03F 2200/375* (2013.01); *H03F 2200/451* (2013.01)

(58) Field of Classification Search
CPC ......... H03F 2200/111; H03F 2200/451; H03F 2200/102; H03F 1/0211; H03F 3/24; H03F 3/189; H04L 27/2601
USPC .............................................. 330/136, 297
See application file for complete search history.

(56) References Cited

U.S. PATENT DOCUMENTS

| | | | |
|---|---|---|---|
| 6,107,862 A | 8/2000 | Mukainakano et al. | |
| 6,141,377 A | 10/2000 | Sharper et al. | |
| 6,141,541 A | 10/2000 | Midya et al. | |
| 6,411,531 B1 | 6/2002 | Nork et al. | |
| 6,985,033 B1 | 1/2006 | Shirali et al. | |
| 7,043,213 B2 | 5/2006 | Robinson et al. | |
| 7,471,155 B1 | 12/2008 | Levesque | |
| 7,570,931 B2 | 8/2009 | McCallister et al. | |
| 7,994,862 B1 | 8/2011 | Pukhovski | |
| 8,461,928 B2 | 6/2013 | Yahav et al. | |
| 8,493,141 B2 | 7/2013 | Khlat et al. | |
| 8,519,788 B2 | 8/2013 | Khlat | |
| 8,588,713 B2 | 11/2013 | Khlat | |
| 8,718,188 B2 | 5/2014 | Balteanu et al. | |
| 8,723,492 B2 | 5/2014 | Korzeniowski | |
| 8,725,218 B2 | 5/2014 | Brown et al. | |
| 8,774,065 B2 | 7/2014 | Khlat et al. | |
| 8,803,603 B2 | 8/2014 | Wimpenny | |
| 8,818,305 B1 | 8/2014 | Schwent et al. | |
| 8,854,129 B2 | 10/2014 | Wilson | |
| 8,879,665 B2 | 11/2014 | Xia et al. | |
| 8,913,690 B2 | 12/2014 | Onishi | |
| 8,989,682 B2 | 3/2015 | Ripley et al. | |
| 9,018,921 B2 | 4/2015 | Gurlahosur | |
| 9,020,451 B2 | 4/2015 | Khlat | |
| 9,041,364 B2 | 5/2015 | Khlat | |
| 9,041,365 B2 | 5/2015 | Kay et al. | |
| 9,055,529 B2 | 6/2015 | Shih | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,538 B2 | 10/2015 | Hong et al. | |
| 9,166,830 B2 | 10/2015 | Camuffo et al. | |
| 9,167,514 B2 | 10/2015 | Dakshinamurthy et al. | |
| 9,197,182 B2 | 11/2015 | Baxter et al. | |
| 9,225,362 B2 | 12/2015 | Drogi et al. | |
| 9,247,496 B2 | 1/2016 | Khlat | |
| 9,263,997 B2 | 2/2016 | Vinayak | |
| 9,270,230 B2 | 2/2016 | Henshaw et al. | |
| 9,270,239 B2 | 2/2016 | Drogi et al. | |
| 9,271,236 B2 | 2/2016 | Drogi | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,377,797 B2 | 6/2016 | Kay et al. | |
| 9,379,667 B2 | 6/2016 | Khlat et al. | |
| 9,445,371 B2 | 9/2016 | Khesbak et al. | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,869 B2 | 3/2017 | Lerdworatawee | |
| 9,595,981 B2 | 3/2017 | Khlat | |
| 9,596,110 B2 | 3/2017 | Jiang et al. | |
| 9,614,477 B1 | 4/2017 | Rozenblit et al. | |
| 9,634,666 B2 | 4/2017 | Krug | |
| 9,748,845 B1 | 8/2017 | Kotikalapoodi | |
| 9,806,676 B2 | 10/2017 | Balteanu et al. | |
| 9,831,834 B2 | 11/2017 | Balteanu et al. | |
| 9,837,962 B2 | 12/2017 | Mathe et al. | |
| 9,923,520 B1 | 3/2018 | Abdelfattah et al. | |
| 10,003,416 B1 | 6/2018 | Lloyd | |
| 10,090,808 B1 | 10/2018 | Henzler et al. | |
| 10,097,145 B1 | 10/2018 | Khlat et al. | |
| 10,103,693 B2 | 10/2018 | Zhu et al. | |
| 10,110,169 B2 | 10/2018 | Khesbak et al. | |
| 10,158,329 B1 | 12/2018 | Khlat | |
| 10,158,330 B1 | 12/2018 | Khlat | |
| 10,170,989 B2 | 1/2019 | Balteanu et al. | |
| 10,291,181 B2 * | 5/2019 | Kim | H03F 3/189 |
| 10,326,408 B2 | 6/2019 | Khlat et al. | |
| 10,382,071 B2 | 8/2019 | Rozek et al. | |
| 10,476,437 B2 | 11/2019 | Nag et al. | |
| 10,879,804 B2 | 12/2020 | Kim et al. | |
| 11,050,433 B1 | 6/2021 | Melanson et al. | |
| 11,121,684 B2 | 9/2021 | Henzler et al. | |
| 11,128,261 B2 | 9/2021 | Ranta et al. | |
| 2002/0167827 A1 | 11/2002 | Umeda et al. | |
| 2003/0107428 A1 | 6/2003 | Khouri et al. | |
| 2004/0266366 A1 | 12/2004 | Robinson et al. | |
| 2005/0090209 A1 | 4/2005 | Behzad | |
| 2005/0227646 A1 | 10/2005 | Yamazaki et al. | |
| 2005/0232385 A1 | 10/2005 | Yoshikawa et al. | |
| 2006/0028271 A1 | 2/2006 | Wilson | |
| 2006/0240786 A1 | 10/2006 | Liu | |
| 2007/0052474 A1 | 3/2007 | Saito | |
| 2007/0258602 A1 | 11/2007 | Vepsalainen et al. | |
| 2008/0116960 A1 | 5/2008 | Nakamura | |
| 2009/0016085 A1 | 1/2009 | Rader et al. | |
| 2009/0045872 A1 | 2/2009 | Kenington | |
| 2009/0191826 A1 | 7/2009 | Takinami et al. | |
| 2010/0283534 A1 | 11/2010 | Pierdomenico | |
| 2010/0308919 A1 | 12/2010 | Adamski et al. | |
| 2011/0074373 A1 | 3/2011 | Lin | |
| 2011/0136452 A1 | 6/2011 | Pratt et al. | |
| 2011/0175681 A1 | 7/2011 | Inamori et al. | |
| 2011/0279179 A1 | 11/2011 | Vice | |
| 2012/0194274 A1 | 8/2012 | Fowers et al. | |
| 2012/0200435 A1 | 8/2012 | Ngo et al. | |
| 2012/0299645 A1 | 11/2012 | Southcombe et al. | |
| 2012/0299647 A1 | 11/2012 | Honjo et al. | |
| 2013/0021827 A1 | 1/2013 | Ye | |
| 2013/0100991 A1 | 4/2013 | Woo | |
| 2013/0127548 A1 | 5/2013 | Popplewell et al. | |
| 2013/0130724 A1 | 5/2013 | Kumar Reddy et al. | |
| 2013/0162233 A1 | 6/2013 | Marty | |
| 2013/0187711 A1 | 7/2013 | Goedken et al. | |
| 2013/0200865 A1 | 8/2013 | Wimpenny | |
| 2013/0271221 A1 | 10/2013 | Levesque et al. | |
| 2014/0009226 A1 | 1/2014 | Severson | |
| 2014/0028370 A1 | 1/2014 | Wimpenny | |
| 2014/0028390 A1 | 1/2014 | Davis | |
| 2014/0057684 A1 | 2/2014 | Khlat | |
| 2014/0103995 A1 | 4/2014 | Langer | |
| 2014/0155002 A1 | 6/2014 | Dakshinamurthy et al. | |
| 2014/0184335 A1 | 7/2014 | Nobbe et al. | |
| 2014/0199949 A1 | 7/2014 | Nagode et al. | |
| 2014/0210550 A1 | 7/2014 | Mathe et al. | |
| 2014/0218109 A1 | 8/2014 | Wimpenny | |
| 2014/0235185 A1 | 8/2014 | Drogi | |
| 2014/0266423 A1 | 9/2014 | Drogi et al. | |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2014/0361837 A1 | 12/2014 | Strange et al. | |
| 2015/0048883 A1 | 2/2015 | Vinayak | |
| 2015/0071382 A1 | 3/2015 | Wu et al. | |
| 2015/0098523 A1 | 4/2015 | Lim et al. | |
| 2015/0139358 A1 | 5/2015 | Asuri et al. | |
| 2015/0155836 A1 | 6/2015 | Midya et al. | |
| 2015/0188432 A1 | 7/2015 | Vannorsdel et al. | |
| 2015/0236652 A1 | 8/2015 | Yang et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |

(56) References Cited

U.S. PATENT DOCUMENTS

| | | |
|---|---|---|
| 2016/0050629 A1 | 2/2016 | Khesbak et al. |
| 2016/0065137 A1 | 3/2016 | Khlat |
| 2016/0099686 A1 | 4/2016 | Perreault |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222178 A1 | 7/2019 | Khlat et al. |
| 2019/0229623 A1 | 7/2019 | Tsuda et al. |
| 2019/0253023 A1 | 8/2019 | Yang et al. |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1 | 1/2020 | Khlat |
| 2020/0127608 A1 | 4/2020 | Khlat |
| 2020/0136561 A1 | 4/2020 | Khlat et al. |
| 2020/0136575 A1 | 4/2020 | Khlat et al. |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2021/0159590 A1 | 5/2021 | Na et al. |
| 2021/0194515 A1 | 6/2021 | Go et al. |

FOREIGN PATENT DOCUMENTS

| | | |
|---|---|---|
| WO | 2018182778 A1 | 10/2018 |
| WO | 2020206246 A1 | 10/2020 |
| WO | 2021046453 A1 | 3/2021 |

OTHER PUBLICATIONS

Notice of Allowance for U.S. Appl. No. 15/888,300, dated Jan. 14, 2020, 11 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/155,127, dated Jun. 1, 2020, 8 pages.
Corrected Notice of Allowability for U.S. Appl. No. 15/888,300, dated May 13, 2020, 7 pages.
Non-Final Office Action for U.S. Appl. No. 16/246,859, dated Apr. 28, 2020, 9 pages.
Notice of Allowance for U.S. Appl. No. 16/354,234, dated Apr. 24, 2020, 9 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.

(56) References Cited

OTHER PUBLICATIONS

Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Final Office Action for U.S. Appl. No. 16/122,611, dated Sep. 18, 2020, 17 pages.
Final Office Action for U.S. Appl. No. 16/174,535, dated Jul. 1, 2020, 7 pages.
Notice of Allowance for U.S. Appl. No. 16/246,859, dated Sep. 18, 2020, 8 pages.
Non-Final Office Action for U.S. Appl. No. 16/284,023, dated Jun. 24, 2020, 7 pages.
Quayle Action for U.S. Appl. No. 16/421,905, dated Aug. 25, 2020, 5 pages.
Non-Final Office Action for U.S. Appl. No. 16/435,940, dated Jul. 23, 2020, 6 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, dated Dec. 4, 2020, 8 pages.
Notice of Allowance for U.S. Appl. No. 16/834,049, dated Jun. 24, 2021, 8 pages.
Notice of Allowance for U.S. Appl. No. 16/122,611, dated Apr. 1, 2021, 8 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Non-Final Office Action for U.S. Appl. No. 16/582,471, dated Mar. 24, 2021, 11 pages.
Notice of Allowance for U.S. Appl. No. 16/582,471, dated Jun. 22, 2021, 9 pages.
Notice of Allowance for U.S. Appl. No. 17/011,313, dated Nov. 4, 2021, 8 pages.
Quayle Action for U.S. Appl. No. 16/855,154, dated Oct. 25, 2021, 6 pages.
Notice of Allowance for U.S. Appl. No. 17/115,982, dated Nov. 12, 2021, 8 pages.
Non-Final Office Action for U.S. Appl. No. 17/126,561, dated Oct. 14, 2021, 6 pages.
Non-Final Office Action for U.S. Appl. No. 17/073,764, dated Dec. 24, 2021, 22 pages.
International Search Report and Written Opinion for International Patent Application No. PCT/US2021/052151, dated Jan. 4, 2022, 16 pages.
Notice of Allowance for U.S. Appl. No. 16/582,471, dated Feb. 1, 2022, 9 pages.
Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.
International Search Report and Written Opinion for International Patent Application No. PCT/US2021/054141 dated Jan. 25, 2022, 15 pages.
Non-Final Office Action for U.S. Appl. No. 17/032,553, dated Mar. 21, 2022, 4 pages.
International Search Report and Written Opinion for International Patent Application No. PCT/US2021/052830, dated Jan. 24, 2022, 13 pages.
Final Office Action for U.S. Appl. No. 16/807,575, dated May 4, 2022, 12 pages.
Final Office Action for U.S. Appl. No. 17/073,764, dated Jun. 1, 2022, 22 pages.

\* cited by examiner

MULTI-BANDWIDTH ENVELOPE TRACKING INTEGRATED CIRCUIT

RELATED APPLICATIONS

This application claims the benefit of provisional patent application Ser. No. 62/835,798, filed Apr. 18, 2019, the disclosure of which is hereby incorporated herein by reference in its entirety.

FIELD OF THE DISCLOSURE

The technology of the disclosure relates generally to an envelope tracking (ET) radio frequency (RF) power amplifier apparatus.

BACKGROUND

Mobile communication devices, such as smartphones, have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience has also led to the rise of so-called wearable devices, such as smartwatches. Over time, these wearable devices have evolved from simple companion devices to mobile communication devices into full-fledged multi-functional wireless communication devices. Nowadays, most wearable electronic devices are often equipped with digital and analog circuitries capable of communicating a radio frequency (RF) signal(s) in a variety of wireless communication systems, such as long-term evolution (LTE), Wi-Fi, Bluetooth, and so on. Like mobile communication devices, wearable devices often employ sophisticated power amplifiers to amplify RF signal(s) to help improve coverage range, data throughput, and reliability of the wearable devices.

Envelope tracking (ET) is a power management technology designed to improve efficiency levels of power amplifiers. In this regard, it may be desirable to employ ET across a variety of wireless communication technologies to help reduce power consumption and thermal dissipation in wearable devices. Notably, the RF signal(s) communicated in different wireless communication systems may correspond to different modulation bandwidths (e.g., from 80 KHz to over 200 MHz). As such, it may be further desirable to ensure that the power amplifiers can maintain optimal efficiency across a wide range of modulation bandwidth.

SUMMARY

Embodiments of the disclosure relate to a multi-bandwidth envelope tracking (ET) integrated circuit (IC) (ETIC). The multi-bandwidth ETIC may be coupled to an amplifier circuit(s) for amplifying a radio frequency (RF) signal modulated in a wide range of modulation bandwidth. In examples discussed herein, the multi-bandwidth ETIC includes an ET voltage circuit configured to generate a modulated voltage based on a supply voltage. The supply voltage may be dynamically adjusted to cause the modulated voltage to transition quickly (e.g., within a cyclic prefix duration) from one voltage level to another voltage level, particularly when the RF signal is modulated in a higher modulation bandwidth (e.g., >200 MHz), without compromising efficiency of the ET voltage circuit. As such, the multi-bandwidth ETIC may generate different modulated voltages based on the modulation bandwidth of the RF signal, thus making it possible to employ the multi-bandwidth ETIC in a wide range of wireless communication devices, such as a fifth-generation (5G) wireless communication device.

In one aspect, a multi-bandwidth ETIC is provided. The multi-bandwidth ETIC includes an ET voltage circuit configured to generate a modulated voltage based on a supply voltage. The multi-bandwidth ETIC also includes a control circuit. The control circuit is configured to determine that the modulated voltage is required to transition from a first voltage level to a second voltage level. The control circuit is also configured to adjust the supply voltage to cause the ET voltage circuit to change the modulated voltage from the first voltage level to the second voltage level by a determined voltage change time.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-bandwidth envelope tracking (ET) integrated circuit (IC) (ETIC). The multi-bandwidth ETIC may be coupled to an amplifier circuit(s) for amplifying a radio frequency (RF) signal modulated in a wide range of modulation bandwidth. In examples discussed herein, the multi-bandwidth ETIC includes an ET voltage circuit configured to generate a modulated voltage based on a supply voltage. The supply voltage may be dynamically adjusted to cause the modulated voltage to transition quickly (e.g., within a cyclic prefix duration) from one voltage level to another voltage level, particularly when the RF signal is modulated in a higher modulation bandwidth (e.g., >200 MHz), without compromising efficiency of the ET voltage circuit. As such, the multi-bandwidth ETIC may generate different modulated voltages based on the modulation bandwidth of the RF signal, thus making it possible to employ the multi-bandwidth ETIC in a wide range of wireless communication devices, such as a fifth-generation (5G) wireless communication device.

Figure 1A:
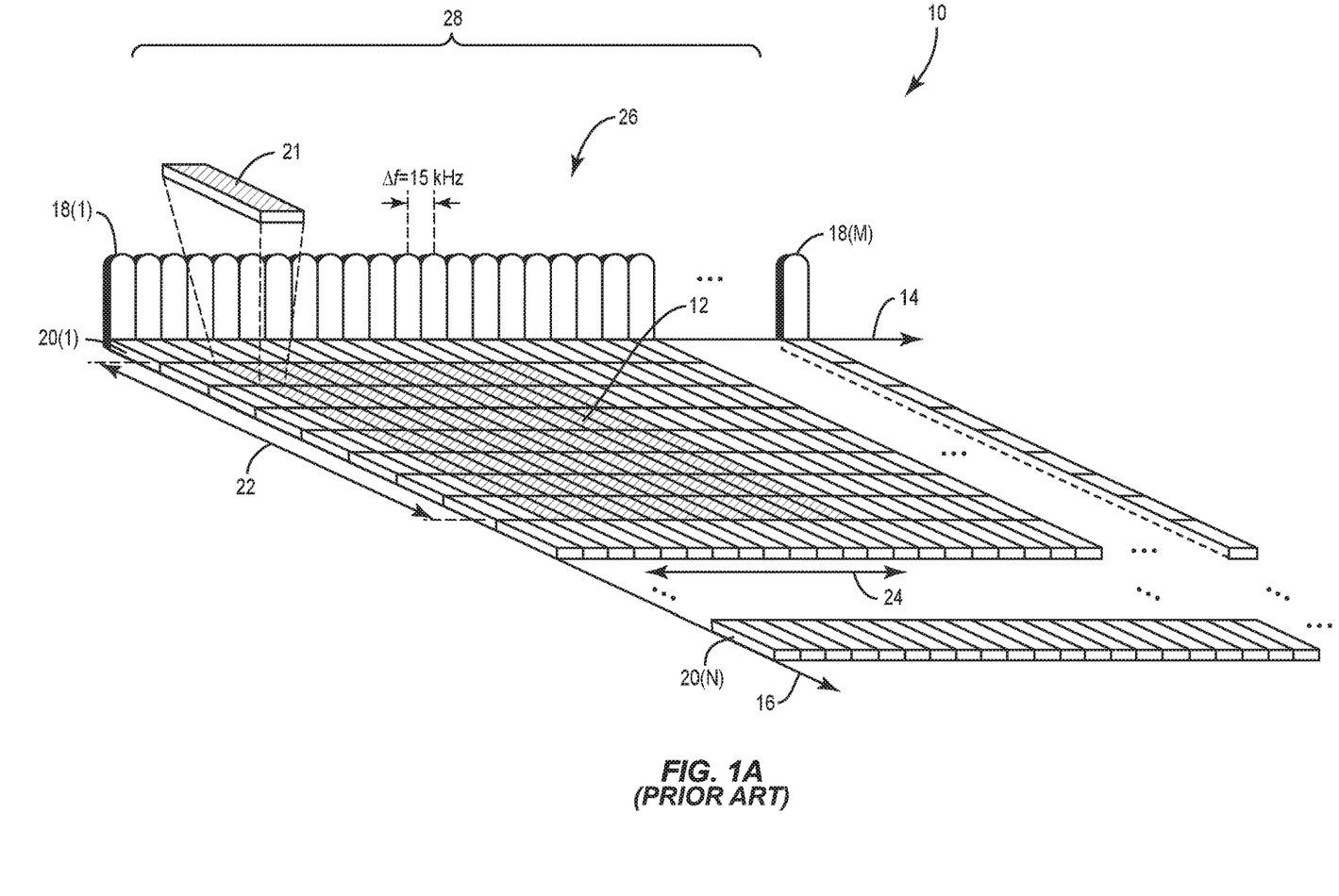
FIG. 1A is a schematic diagram of an exemplary orthogonal frequency division multiplexing (OFDM) time-frequency grid illustrating at least one resource block (RB)
Figure 1B:
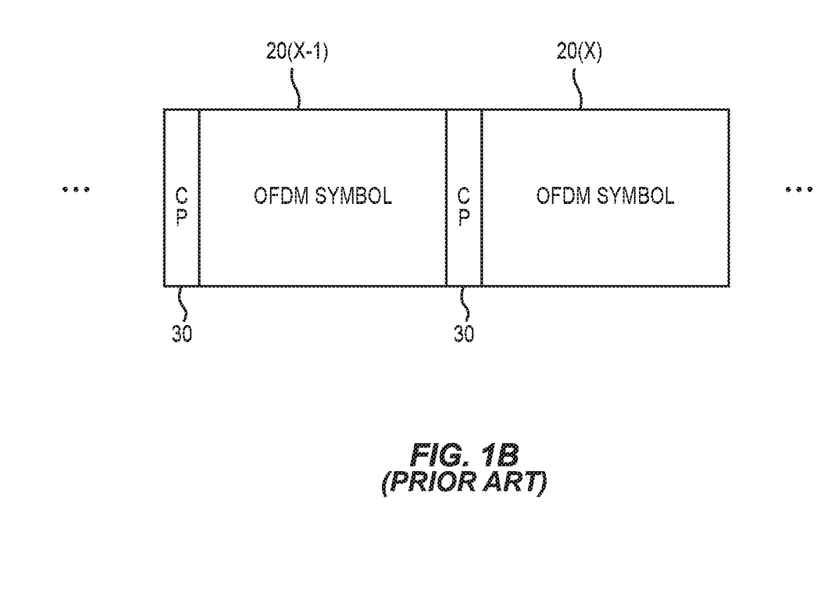
FIG. 1B is a schematic diagram providing an exemplary high-level illustration of an OFDM symbol.

Before discussing a multi-bandwidth ETIC of the present disclosure, a brief overview of a resource block (RB)-based resource allocation scheme and a high-level orthogonal frequency division multiplexing (OFDM) symbol structure is first provided with reference FIGS. 1A and 1B to help understand the relationship between a modulation bandwidth of an RF signal and a number of RBs allocated to the RF signal. The discussion of specific exemplary aspects of a multi-bandwidth ETIC of the present disclosure starts below with reference to FIG. 2.

In this regard, FIG. 1A is a schematic diagram of an exemplary OFDM time-frequency grid 10 illustrating at least one RB 12. The OFDM time-frequency grid 10 includes a frequency axis 14 and a time axis 16. Along the frequency axis 14, there are a number of subcarriers 18(1)-18(M). The subcarriers 18(1)-18(M) are orthogonally separated from each other by a frequency spacing $\Delta f$ (e.g. 15 KHz). Along the time axis 16, there are a number of OFDM symbols 20(1)-20(N). Each intersection of the subcarriers 18(1)-18M) and the OFDM symbols 20(1)-20(N) defines a resource element (RE) 21.

In one example, the RB 12 includes twelve (12) consecutive subcarriers among the subcarriers 18(1)-18(M), and seven (7) consecutive OFDM symbols among the OFDM symbols 20(1)-20(N). In this regard, the RB 12 includes eighty-four (84) of the REs 21 (12 subcarriers×7 OFDM symbols). The RB 12 has an RB duration 22, which equals one-half millisecond (0.5 ms), along the time axis 16. Accordingly, the RB 12 has a bandwidth 24, which equals 180 KHz (15 KHz/subcarrier×12 subcarriers), along the frequency axis 14. In OFDM-based communication systems such as long-term evolution (LTE), the RB 12 is the minimum unit for allocating resources to users.

In an LTE system, an RF signal 26 can occupy multiple subcarriers among the subcarriers 18(1)-18(N). In this regard, a signal bandwidth 28 of the RF signal 26 is a function of the number of RBs 12 contained in the RF signal 26 along the frequency axis 14. In this regard, if the RF signal 26 contains ten (10) RBs 12, then the signal bandwidth 28 will be 1.8 MHz (180 KHz/RB×10 RBs). If the RF signal 26 contains twenty-five (25) RBs 12, then the signal bandwidth 28 will be 4.5 MHz (180 KHz/RB×25 RBs). If the RF signal 26 contains two hundred (200) RBs 12, then the signal bandwidth 28 will be 36 MHz (180 KHz/RB×200 RBs). In this regard, the more RBs 12 the RF signal 26 contains, the wider the signal bandwidth 28 will be, and the more subcarriers among the subcarriers 18(1)-18(M) are modulated within the RB duration 22. As such, the RF signal 26 can exhibit more and faster amplitude variations within the RB duration 22 when the RF signal 26 is modulated according to a selected modulation and coding scheme (MCS). As a result, when the RF signal 26 is amplified for transmission over a wireless medium, an ET amplifier circuit would need to operate fast enough to keep up with the faster amplitude variations of the RF signal 26 across the signal bandwidth 28 within the RB duration 22.

FIG. 1B is a schematic diagram providing an exemplary high-level illustration of two consecutive OFDM symbols 20(X−1), 20(X) (1≤X≤N) among the OFDM symbols 20(1)-20(N) in FIG. 1A. As shown in FIG. 1B, the OFDM symbols 20(X−1), 20(X) are each preceded by a respective cyclic prefix (CP) 30. In one example, the CP 30 may be configured to provide a guard interval to help eliminate inter-symbol interference between the OFDM symbols 20(X−1), 20(X). In another example, the CP 30 can be utilized to adjust respective power levels of the OFDM symbols 20(X−1), 20(X). The CP 30 can be configured to different durations based on the subcarrier spacing $\Delta f$ (also known as SCS), as summarized in Table 1 below.

TABLE 1

| SCS (KHz) | Bandwidth (MHz) | Symbol Duration (µs) | CP (µs) |
|---|---|---|---|
| 15 | 50 | 66.7 | 4.7 |
| 30 | 100 | 33.3 | 2.3 |
| 60 | 200 | 16.7 | 1.2 |
| 120 | 400 | 8.33 | 0.58 |
| 240 | 400 | 4.16 | 0.29 |

Notably, a 5G RF signal transmitted in a 5G wireless communication system can experience a higher peak-to-average ratio (PAR). In this regard, the 5G RF signal may experience a large power variation (e.g., from peak to bottom or from bottom to peak) between the OFDM symbols 20(X−1), 20(X). Moreover, the 5G RF signal may be modulated to a higher bandwidth (e.g., 400 MHz) based on a shorter CP 30 (e.g., 0.29 µs) to boost data rate and throughput in the 5G wireless communication system. As such, a power amplifier circuit configured to amplify the 5G RF signal needs to be able to ramp up or ramp down the power level of the 5G RF signal within the CP 30, which can be as short as 0.29 µs.

Figure 2:
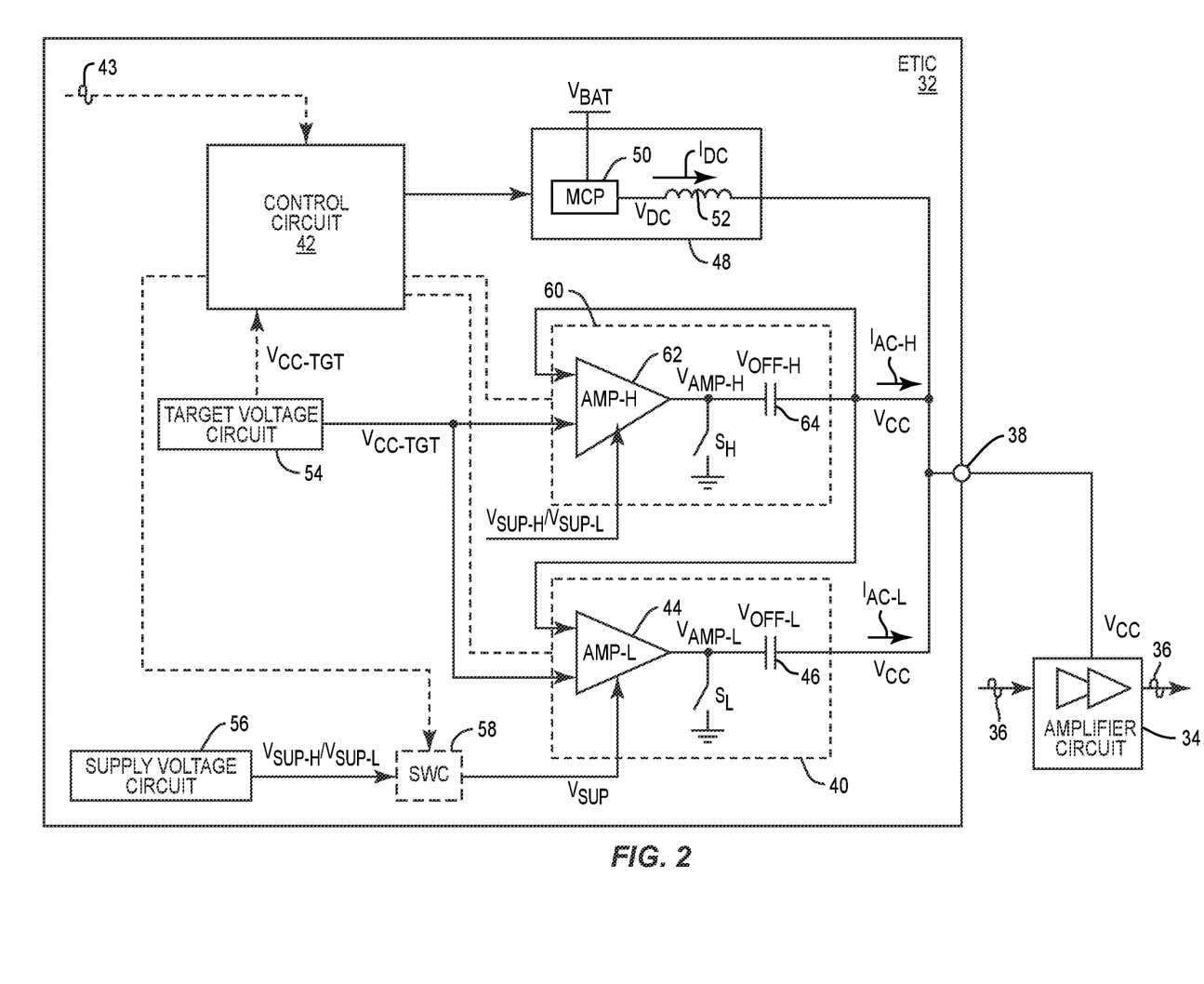
FIG. 2 is a schematic diagram of an exemplary multi-bandwidth envelope tracking (ET) integrated circuit (IC) (ETIC) configured according to an embodiment of the present disclosure to generate a modulated voltage in a wider-range of modulation bandwidth.

In this regard, FIG. 2 is a schematic diagram of an exemplary multi-bandwidth ETIC 32 configured according to an embodiment of the present disclosure to generate a modulated voltage $V_{CC}$ in a wider-range of modulation bandwidth. In a non-limiting example, the multi-bandwidth ETIC 32 is coupled to an amplifier circuit 34 configured to amplify an RF signal 36 based on the modulated voltage $V_{CC}$. Accordingly, the multi-bandwidth ETIC 32 can be configured to generate the modulated voltage $V_{CC}$ based on the modulation bandwidth of the RF signal 36. The multi-bandwidth ETIC 32 may include an output port 38 configured to provide the modulated voltage $V_{CC}$ to the amplifier circuit 34 for amplifying the RF signal 36.

In a non-limiting example, the RF signal 36 can be a 5G RF signal modulated based on 240 KHz SCS (as shown in Table 1). In this regard, when the RF signal 36 exhibits a rapid power change between two consecutive symbols, such as the OFDM symbols 20(X−1), 20(X) in FIG. 1B, the amplifier circuit 34 needs to ramp up or ramp down the power of the RF signal 36 accordingly. To enable the amplifier circuit 34 to ramp up or ramp down the power of the RF signal 36 between the two consecutive symbols, the multi-bandwidth ETIC 32 needs to ramp up or ramp down the modulated voltage $V_{CC}$ within the CP 30 (as shown in FIG. 1B), which can be as short as 0.29 µs, to prevent distortions as amplitude clipping in the RF signal 36.

In this regard, the multi-bandwidth ETIC 32 employs an ET voltage circuit 40 and a control circuit 42, which can be a microprocessor, a microcontroller, of a field-programmable gate array (FPGA) for example, to make sure that the modulated voltage $V_{CC}$ can transition from a first power level to a second power level by a determined voltage change time, such as an end of the CP 30. More specifically, the ET voltage circuit 40 is configured to generate the modulated voltage $V_{CC}$ based on a supply voltage $V_{SUP}$. The control circuit 42 is configured to determine the modulation bandwidth of the RF signal 36, for example based on an indication signal 43 provided by a coupled transceiver circuit (not shown). In specific examples discussed herein, the multi-bandwidth ETIC 32 can be configured to generate different modulated voltages $V_{CC}$ at the output port 38 when the RF signal 36 is modulated in a first modulation bandwidth (e.g., >200 MHz), a second modulation bandwidth (e.g., >1 MHz and 200 MHz), a third modulation bandwidth (e.g., >120 KHz and 1 MHz), and a fourth modulation bandwidth (e.g., 120 KHz).

When the RF signal 36 is modulated in the first modulation bandwidth, the control circuit 42 is configured to determine whether the modulated voltage $V_{CC}$ needs to transition from a first voltage level to a second voltage level between two consecutive symbols, such as the OFDM symbols 20(X−1), 20(X) in FIG. 1B. In response to determining that the modulated voltage $V_{CC}$ needs to transition from the first voltage level to the second voltage level, the control circuit 42 can be configured to dynamically adjust the supply voltage $V_{SUP}$ to cause the ET voltage circuit 40 to change the modulated voltage $V_{CC}$ from the first voltage level to the second voltage level by the determined voltage change time. By enabling the modulated voltage $V_{CC}$ to transition from the first voltage level to the second voltage level by the determined voltage change time, the multi-bandwidth ETIC 32 may be able to change the modulated voltage $V_{CC}$ rapidly (e.g., within the CP 30) to keep up with the rapid power change in the RF signal 36.

The ET voltage circuit 40 can be configured to include a voltage amplifier 44 (denoted as "AMP-L"), an offset capacitor 46, and a switch $S_L$. The offset capacitor 46 is coupled between the voltage amplifier 44 and the output port 38. When the voltage amplifier 44 is activated and the switch $S_L$ is open, the ET voltage circuit 40 is said to be activated. In this regard, the voltage amplifier 44 is configured to generate an initial modulated voltage $V_{AMP-L}$ based on a modulated target voltage $V_{CC-TGT}$ and the supply voltage $V_{SUP}$. The offset capacitor 46 is configured to raise the initial modulated voltage $V_{AMP-L}$ by a modulated offset voltage $V_{OFF-L}$ to generate the modulated voltage $V_{CC}$ at the output port 38 ($V_{CC}=V_{AMP-L}+V_{OFF-L}$). Notably, the amplifier circuit 34 may see the modulated voltage $V_{CC}$ as an average power tracking (APT) modulated voltage despite that the ET voltage circuit 40 is configured to generated the modulated voltage $V_{CC}$ based on the modulated target voltage $V_{CC-TGT}$ in an ET fashion.

When the voltage amplifier 44 is deactivated and the switch $S_L$ is open, the ET voltage circuit 40 is said to be deactivated. Accordingly, the ET voltage circuit 40 will not generate the modulated voltage $V_{CC}$ at the output port 38.

In contrast, when the voltage amplifier 44 is deactivated and the switch $S_L$ is closed, the offset capacitor 46 is coupled between the output port 38 and to a ground. In this regard, the offset capacitor 46 is said to be activated.

The multi-bandwidth ETIC 32 includes a tracker circuit 48 coupled to the output port 38 and configured to generate the modulated offset voltage $V_{OFF-L}$ across the offset capacitor 46. In a non-limiting example, the tracker circuit 48 includes a multi-level charge pump (MCP) 50 and a power inductor 52. The MCP 50 can be configured to generate a low-frequency voltage $V_{DC}$ (e.g., a constant voltage) based on a battery voltage $V_{BAT}$. The power inductor 52 may be configured to induce a low-frequency current $I_{DC}$ (e.g., a direct current) at the output port 38 based on the low-frequency voltage $V_{DC}$. When the ET voltage circuit 40 is activated to generate the modulated voltage $V_{CC}$, the tracker circuit 48 provides the low-frequency voltage $V_{DC}$ across the offset capacitor 46 as the modulated offset voltage $V_{OFF-L}$.

Figure 3A:
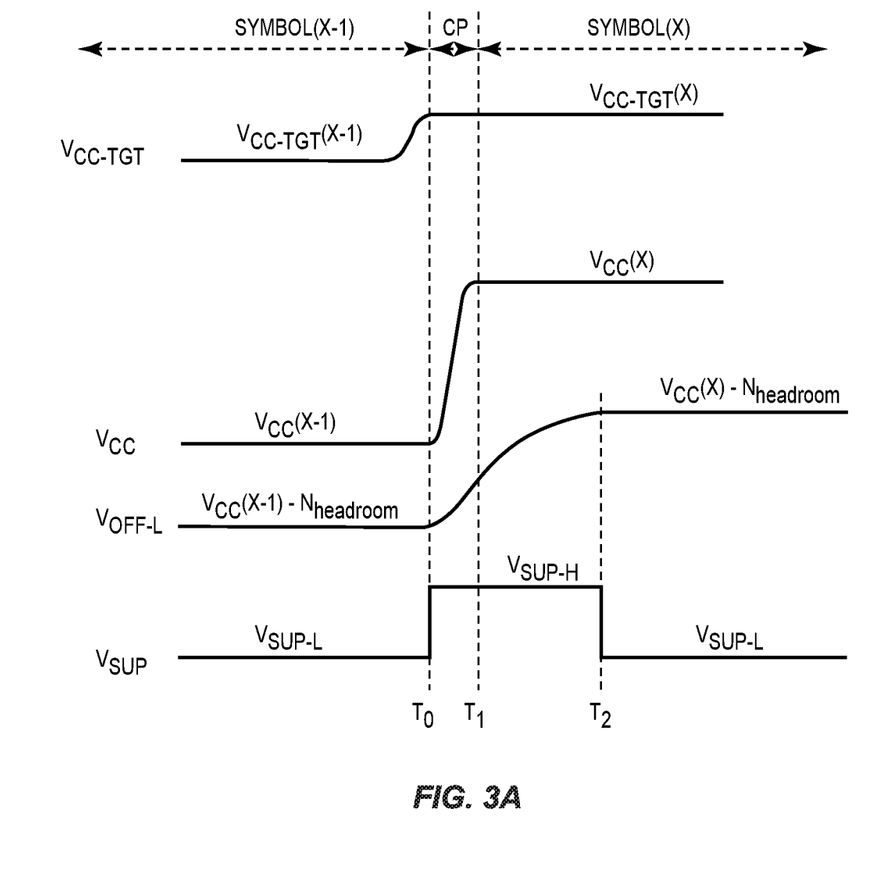
FIG. 3A is a graphic diagram providing an exemplary illustration of how a control circuit in the multi-bandwidth ETIC of FIG. 2 detects and reacts to an upcoming increase of the modulated voltage between two consecutive OFDM symbols.
Figure 3B:
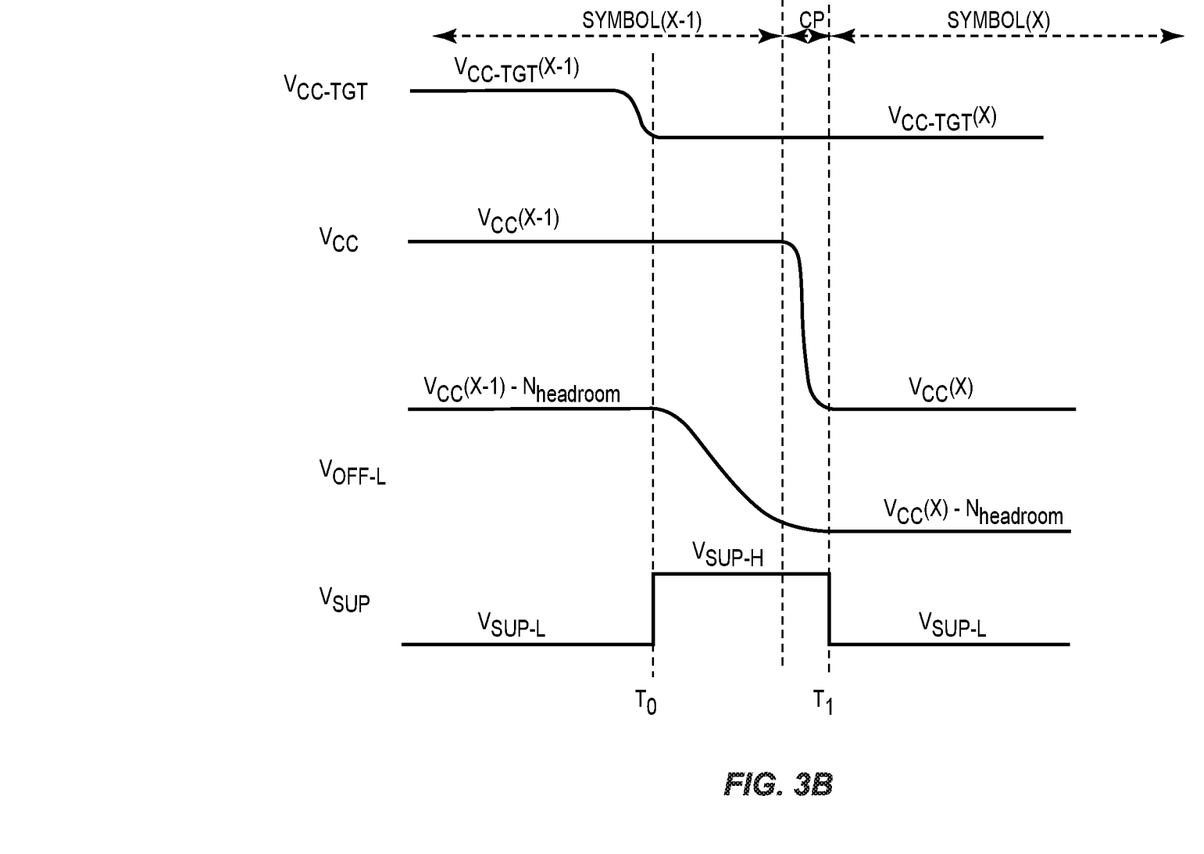
FIG. 3B is a graphic diagram providing an exemplary illustration of how a control circuit in the multi-bandwidth ETIC of FIG. 2 detects and reacts to an upcoming decrease of the modulated voltage between two consecutive OFDM symbols.

The multi-bandwidth ETIC 32 may include a target voltage circuit 54 configured to generate and provide the modulated target voltage $V_{CC\text{-}TGT}$ to the voltage amplifier 44. Accordingly, the ET voltage circuit 40 can generate the modulated voltage $V_{CC}$ that tracks (rises and falls) the modulated target voltage $V_{CC\text{-}TGT}$. In this regard, the modulated target voltage $V_{CC\text{-}TGT}$ may be used by the control circuit 42 as an indicator to help determine whether the modulated voltage $V_{CC}$ is required to transition from the first voltage level to the second voltage level. To further illustrate how the control circuit 42 detects and reacts to an upcoming change of the modulated voltage $V_{CC}$, FIGS. 3A and 3B are discussed next as non-limiting examples. Elements of FIG. 2 are referenced in conjunction with FIGS. 3A and 3B and will not be re-described herein.

FIG. 3A is a graphic diagram providing an exemplary illustration of how the control circuit 42 detects and reacts to an upcoming increase of the modulated voltage $V_{CC}$ between two consecutive OFDM symbols Symbol(X−1) (also referred to as a "first OFDM symbol") and Symbol(X) (also referred to as a "second OFDM symbol"). In a non-limiting example, the OFDM symbols Symbol(X−1) and Symbol(X) in FIG. 3A are identical to the OFDM symbols 20(X−1) and 20(X) in FIG. 1B, respectively. The OFDM symbols Symbol(X−1) and Symbol(X) are separated by a CP, which can be as short as 0.29 μs according to Table 1.

At time $T_0$, which may correspond to an ending boundary of the OFDM symbol Symbol(X−1), the modulated target voltage $V_{CC\text{-}TGT}$ rises from a present level $V_{CC\text{-}TGT}(X-1)$ to a future level $V_{CC\text{-}TGT}(X)$. As such, the control circuit 42 can determine that the modulated voltage $V_{CC}$ will increase from a first voltage level $V_{CC}(X-1)$ (e.g., 1 V) to a second voltage level $V_{CC}(X)$ (e.g., 5 V). Thus, the control circuit 42 needs to make sure that the modulated voltage $V_{CC}$ can reach the second voltage level $V_{CC}(X)$ by a determined voltage change time $T_1$, which corresponds to an ending boundary of the CP and a beginning boundary of the OFDM symbol Symbol(X).

When the ET voltage circuit 40 generates the modulated voltage $V_{CC}$ at the first voltage level $V_{CC}(X-1)$ (e.g., 1 V) during the OFDM symbol Symbol(X−1), the voltage amplifier 44 may generate the initial modulated voltage $V_{AMP-L}$ based on a first lower supply voltage $V_{SUP-L}$. In a non-limiting example, the lower supply voltage $V_{SUP-L}$ can be expressed in Eq. 1 below.

$$V_{SUP-L}=N_{headroom}+P_{headroom} \quad (Eq. 1)$$

In Eq. 1 above, $N_{headroom}$ represents a predefined minimum voltage headroom required between an n-type field-effect transistor (NFET) (not shown) and a ground in the voltage amplifier 44. $P_{headroom}$ represents a predefined minimum voltage headroom required between a p-type field-effect transistor (PFET) (not shown) and a supply voltage node (not shown) in the voltage amplifier 44. By providing the lower supply voltage $V_{SUP-L}$ to the voltage amplifier 44, it may be possible for the voltage amplifier 44 to operate at a desirable efficiency level.

In a non-limiting example, for the ET voltage circuit 40 to generate the modulated voltage $V_{CC}$ at the first voltage level $V_{CC}(X-1)$ of approximately 1 V, the voltage amplifier 44 can be configured to generate the initial modulated voltage $V_{AMP-L}$ at the $N_{headroom}$ (e.g., 0.2 V) ($V_{AMP-L}=N_{headroom}$). In the meantime, the tracker circuit 48 may generate the modulated offset voltage $V_{OFF-L}$ ($V_{OFF-L}=V_{CC}(X-1)$ $V_{AMP-L}=V_{CC}(X-1)-N_{headroom}$) at a first offset voltage level (e.g., 0.8 V) corresponding to the first voltage level $V_{CC}(X-1)$. As a result, the ET voltage circuit 40 can generate the modulated voltage $V_{CC}$ at the first voltage level $V_{CC}(X-1)$ of approximately 1 V.

In this regard, if the voltage amplifier 44 maintains the initial modulated voltage $V_{AMP-L}$ at the $N_{headroom}$ of approximately 0.2 V, the modulated offset voltage $V_{OFF-L}$ would need to increase from the first offset voltage level $V_{CC}(X-1)-N_{headroom}$ of approximately 0.8 V to a second offset voltage level $V_{CC}(X)-N_{headroom}$ of approximately 4.8 V by the determined voltage change time $T_1$ such that the modulated voltage $V_{CC}$ can reach the second voltage level $V_{CC}(X)$ of approximately 5 V by the determined voltage change time $T_1$. However, it may be difficult for the modulated offset voltage $V_{OFF-L}$ to reach the second offset voltage level $V_{CC}(X)-N_{headroom}$ (e.g., 4.8 V) by the determined voltage change time $T_1$ due to an inductor-conductor (LC) time constant associated with the power inductor 52 and the offset capacitor 46. As such, the tracker circuit 48 may only be able to increase the modulated offset voltage $V_{OFF-L}$ from the first offset voltage level $V_{CC}(X-1)-N_{headroom}$ to the second offset voltage level $V_{CC}(X)-N_{headroom}$ at time $T_2$, which is after the determined voltage change time $T_1$. As a result, there exists a possibility that the ET voltage circuit 40 might not be able to ramp up the modulated voltage $V_{CC}$ to the second voltage level $V_{CC}(X)$ by the determined voltage change time $T_1$.

To ensure that the ET voltage circuit 40 can ramp up the modulated voltage $V_{CC}$ to the second voltage level $V_{CC}(X)$ by the determined voltage change time $T_1$, the control circuit 42 can be configured to increase the supply voltage $V_{SUP}$ from the lower supply voltage level $V_{SUP-L}$ to a higher supply voltage level $V_{SUP-H}$ in response to determining that the modulated voltage $V_{CC}$ is transitioning from the first voltage level $V_{CC}(X-1)$ to the second voltage level $V_{CC}(X)$ (e.g., at time $T_0$). By increasing the supply voltage $V_{SUP}$, the voltage amplifier 44 may generate a high-frequency current $I_{AC-L}$ (e.g., an alternating current) and/or increase the initial modulated voltage $V_{AMP-L}$ to help compensate for the slower rise of the modulated offset voltage $V_{OFF-L}$. As a result, it may be possible for the ET voltage circuit 40 to increase the modulated voltage $V_{CC}$ from the first voltage level $V_{CC}(X-1)$ to the second voltage level $V_{CC}(X)$ by the determined voltage change time $T_1$. In a non-limiting example, the higher supply voltage level $V_{SUP-H}$ can be determined based on Eq. 2 below.

$$V_{SUP-H} \geq N_{headroom}+P_{headroom}+V_{CC}(X)-V_{CC}(X-1) \quad (Eq. 2)$$

As soon as the modulated offset voltage $V_{OFF-L}$ reaches the second offset voltage level $V_{CC}(X)-N_{headroom}$ (e.g., at time $T_2$), the control circuit 42 may reduce the supply voltage $V_{SUP}$ back to the lower supply voltage $V_{SUP-L}$. As a result, the voltage amplifier 44 may return to operating at the higher efficiency.

FIG. 3B is a graphic diagram providing an exemplary illustration of how the control circuit 42 detects and reacts to an upcoming decrease of the modulated voltage $V_{CC}$ between the two consecutive OFDM symbols Symbol(X−1) and Symbol(X). In a non-limiting example, the OFDM symbols Symbol(X−1) and Symbol(X) in FIG. 3B are identical to the OFDM symbols 20(X−1) and 20(X) in FIG. 1B, respectively. The OFDM symbols Symbol(X−1) and Symbol(X) are separated by the CP, which can be as short as 0.29 μs according to Table 1.

During the OFDM symbol Symbol(X−1), the voltage amplifier 44 may be configured to operate based on the lower supply voltage $V_{SUP-L}$ for higher operating efficiency. At time $T_0$, which may be earlier than the ending boundary of the OFDM symbol Symbol(X−1), the modulated target voltage $V_{CC-TGT}$ falls from the present level $V_{CC-TGT}(X-1)$ to the future level $V_{CC-TGT}(X)$. As such, the control circuit 42 can determine that the modulated voltage $V_{CC}$ will decrease from the first voltage level $V_{CC}(X-1)$ (e.g., 5 V) to the second voltage level $V_{CC}(X)$ (e.g., 1 V). Thus, the control circuit 42 needs to make sure that the modulated voltage $V_{CC}$ can be reduced to the second voltage level $V_{CC}(X)$ by the determined voltage change time $T_1$, which corresponds to the ending boundary of the CP and the beginning boundary of the OFDM symbol Symbol(X).

In a non-limiting example, the control circuit 42 can be configured to cause the tracker circuit 48 to start decreasing the modulated offset voltage $V_{OFF-L}$ from the first offset voltage level $V_{CC}(X-1)-N_{headroom}$ toward the second offset voltage level $V_{CC}(X)-N_{headroom}$ at time $T_0$. However, when the modulated offset voltage $V_{OFF-L}$ starts to decrease prior to the determined voltage change time $T_1$, the modulated voltage $V_{CC}$ may decrease prematurely from the first voltage level $V_{CC}(X-1)$ ahead of the determined voltage change time $T_1$. In this regard, the control circuit 42 can be configured to increase the supply voltage $V_{SUP}$ from the lower supply voltage $V_{SUP-L}$ to the higher supply voltage $V_{SUP-H}$ to help compensate for the decrease in the modulated offset voltage $V_{OFF-L}$. As a result, the ET voltage circuit 40 may be able to maintain the modulated voltage $V_{CC}$ at the first voltage level $V_{CC}(X-1)$ until the determined voltage change time $T_1$. At the determined voltage change time $T_1$, the ET voltage circuit 40 may have reduced the modulated voltage $V_{CC}$ from the first voltage level $V_{CC}(X-1)$ to the second voltage level $V_{CC}(X)$. Accordingly, the control circuit 42 may decrease the supply voltage $V_{SUP}$ back to the lower supply voltage $V_{SUP-L}$ to keep the voltage amplifier 44 operating at the higher operating efficiency.

With reference back to FIG. 2, the multi-bandwidth ETIC 32 includes a supply voltage circuit 56 configured to generate the lower supply voltage $V_{SUP-L}$ and the higher supply voltage $V_{SUP-H}$. The control circuit 42 may be configured to decrease the supply voltage $V_{SUP}$ by coupling the lower supply voltage $V_{SUP-L}$ to the voltage amplifier 44 or increase the supply voltage $V_{SUP}$ by coupling the higher supply voltage $V_{SUP-H}$ to the voltage amplifier 44. In one non-limiting example, the voltage amplifier 44 can be configured to include a pair of output stages (not shown). In this regard, the control circuit 42 may selectively couple the lower supply voltage $V_{SUP-L}$ and the higher supply voltage $V_{SUP-H}$ to the pair of output stages, respectively. In another non-limiting example, the voltage amplifier 44 can be configured to include a single output stage (not shown). In this regard, the multi-bandwidth ETIC 32 may include a switching circuit 58 (denoted as "SWC"). Accordingly, the control circuit 42 may control the switching circuit 58 to selectively couple the lower supply voltage $V_{SUP-L}$ or the higher supply voltage $V_{SUP-H}$ to the single output stage in the voltage amplifier 44.

The multi-bandwidth ETIC 32 can also be configured to generate the modulated voltage $V_{CC}$ when the RF signal 36 is modulated in the second modulation bandwidth (e.g., >1 MHz and 200 MHz). In this regard, the multi-bandwidth ETIC 32 can be configured to include a second ET voltage circuit 60 configured to generate the modulated voltage $V_{CC}$ when the RF signal 36 is modulated in the second modulation bandwidth. The second ET voltage circuit 60 can include a second voltage amplifier 62 (denoted as "AMP-H"), a second offset capacitor 64, and a second switch $S_H$. The second offset capacitor 64 is coupled between the second voltage amplifier 62 and the output port 38. The second offset capacitor 64 can have a substantially larger capacitance than the offset capacitor 46. For example, the second offset capacitor 64 can have a capacitance at least thirty times larger than a capacitance of the offset capacitor 46.

In response to determining that the RF signal 36 is modulated in the second modulation bandwidth (e.g., based on the indication signal 43), the control circuit 42 may activate the second ET voltage circuit 60 and deactivate the ET voltage circuit 40. Specifically, the control circuit 42 may activate the second ET voltage circuit 60 by activating the second voltage amplifier 62 and opening the second switch $S_H$. The control circuit 42 may control the switching circuit 58 to provide the lower supply voltage $V_{SUP-L}$ or the higher supply voltage $V_{SUP-H}$ to the second voltage amplifier 62. The target voltage circuit 54 may be further configured to provide the modulated target voltage $V_{CC-TGT}$ to the second voltage amplifier 62. Accordingly, the second voltage amplifier 62 can generate a second initial modulated voltage $V_{AMP-H}$ and source a second high-frequency current $I_{AC-H}$ (e.g., an alternating current) based on the modulated target voltage $V_{CC-TGT}$ as well as the lower supply voltage $V_{SUP-L}$ or the higher supply voltage $V_{SUP-H}$. The second offset capacitor 64 is configured to raise the second initial modulated voltage $V_{AMP-H}$ by a second modulated offset voltage $V_{OFF-H}$ to generate the modulated voltage $V_{CC}$ at the output port 38 ($V_{CC}=V_{AMP-H}+V_{OFF-H}$). The control circuit 42 may further cause the tracker circuit 48 to generate the second modulated offset voltage $V_{OFF-H}$ across the second offset capacitor 64. Notably, the amplifier circuit 34 sees the modulated voltage $V_{CC}$ as an ET modulated voltage and operates based on the modulated voltage $V_{CC}$ in an ET fashion.

The multi-bandwidth ETIC 32 can also be configured to generate the modulated voltage $V_{CC}$ when the RF signal 36 is modulated in the third modulation bandwidth (e.g., >120 KHz and 1 MHz). In response to determining that the RF signal 36 is modulated in the third modulation bandwidth (e.g., based on the indication signal 43), the control circuit 42 may deactivate the second ET voltage circuit 60, deactivate the voltage amplifier 44, and activate the offset capacitor 46. Specifically, the control circuit 42 may deactivate the second ET voltage circuit 60 by deactivating the second voltage amplifier 62 and opening the second switch $S_H$. The control circuit 42 may cause the tracker circuit 48 to generate the modulated offset voltage $V_{OFF-L}$ across the offset capacitor 46. In this regard, the modulated voltage $V_{CC}$ may correspond to the modulated offset voltage $V_{OFF-L}$. Notably, the amplifier circuit 34 sees the modulated voltage $V_{CC}$ as an ET modulated voltage and operates based on the modulated voltage $V_{CC}$ in an ET fashion.

The multi-bandwidth ETIC 32 can also be configured to generate the modulated voltage $V_{CC}$ when the RF signal 36 is modulated in the fourth modulation bandwidth (e.g., 120 KHz). In response to determining that the RF signal 36 is modulated in the fourth modulation bandwidth (e.g., based on the indication signal 43), the control circuit 42 may deactivate the ET voltage circuit 40, deactivate the second voltage amplifier 62, and activate the second offset capacitor 64. Specifically, the control circuit 42 may activate the second offset capacitor 64 by closing the second switch $S_H$. The control circuit 42 may cause the tracker circuit 48 to generate the second modulated offset voltage $V_{OFF-H}$ across the second offset capacitor 64. In this regard, the modulated voltage $V_{CC}$ may correspond to the second modulated offset voltage $V_{OFF-H}$. Notably, the amplifier circuit 34 sees the modulated voltage $V_{CC}$ as an ET modulated voltage and operates based on the modulated voltage $V_{CC}$ in an ET fashion.

The multi-bandwidth ETIC 32 may also be configured to generate the modulated voltage $V_{CC}$ as an APT voltage. In this regard, the control circuit 42 may be configured to deactivate the ET voltage circuit 40 and the second ET voltage circuit 60. The control circuit 42 may control the tracker circuit 48 to generate and provide the low-frequency voltage $V_{DC}$ to the output port 38 as the modulated voltage $V_{CC}$. Notably, the amplifier circuit 34 sees the modulated voltage $V_{CC}$ as an APT modulated voltage and operates based on the modulated voltage $V_{CC}$ in an APT fashion.

Figure 4:
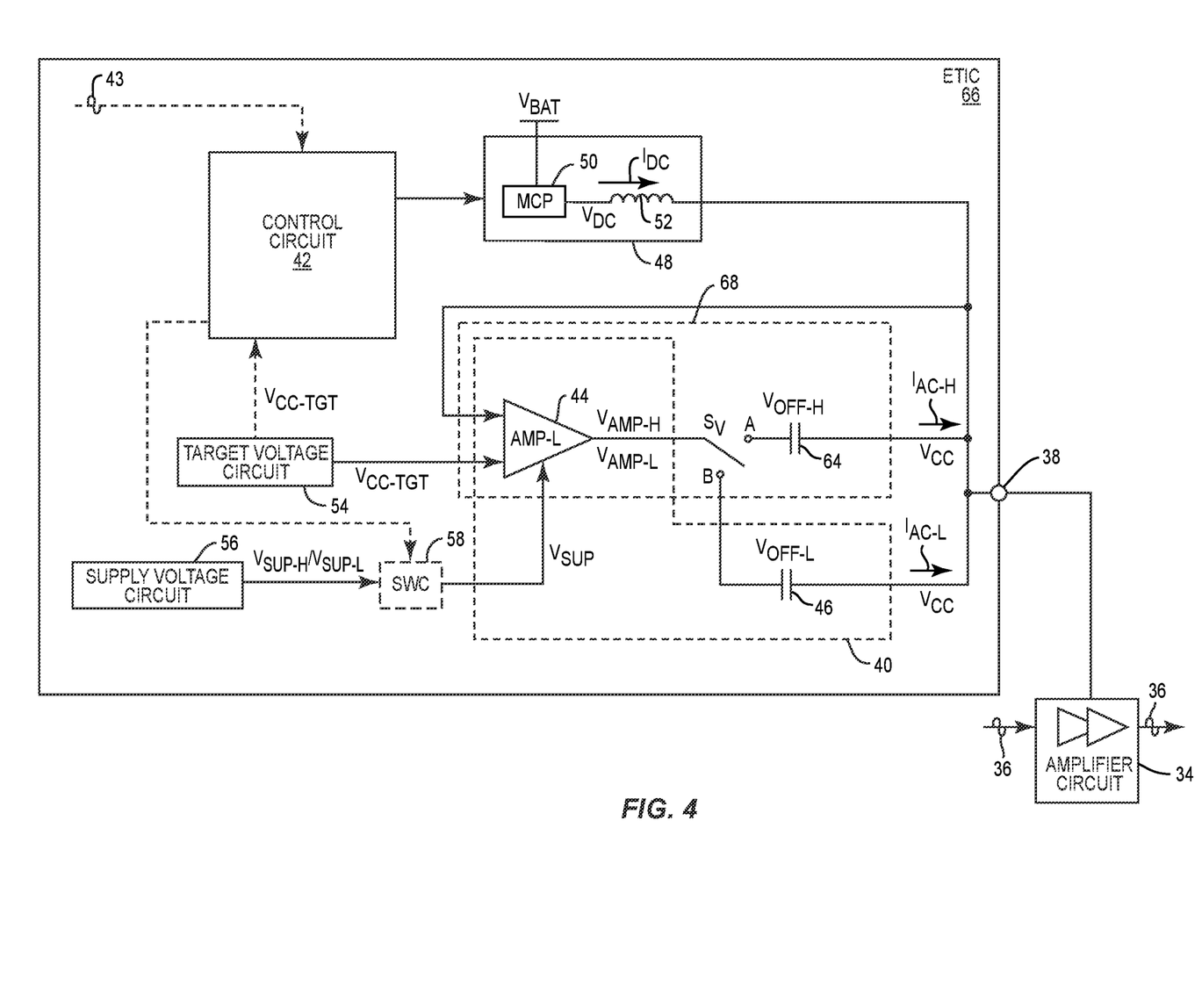
FIG. 4 is a schematic diagram of an exemplary multi-bandwidth ETIC configured according to another embodiment of the present disclosure.

Alternative to employing the voltage amplifier 44 and the second voltage amplifier 62 in the ET voltage circuit 40 and the second ET voltage circuit 60, respectively, it may be possible to share a single voltage amplifier between the ET voltage circuit 40 and the second ET voltage circuit 60. In this regard, FIG. 4 is a schematic diagram of an exemplary multi-bandwidth ETIC 66 configured according to another embodiment of the present disclosure. Common elements between FIGS. 2 and 4 are shown therein with common element numbers and will not be re-described herein.

The multi-bandwidth ETIC 66 includes a second ET voltage circuit 68 configured to share the voltage amplifier 44. The multi-bandwidth ETIC 66 may include a switch $S_V$ configured to alternately couple the voltage amplifier 44 to the offset capacitor 46 or the second offset capacitor 64. When the voltage amplifier 44 is coupled to the offset capacitor 46, the voltage amplifier 44 generates the initial modulated voltage $V_{AMP-L}$ and the tracker circuit 48 provides the modulated offset voltage $V_{OFF-L}$ across the offset capacitor 46. Accordingly, the ET voltage circuit 40 generates the modulated voltage $V_{CC}$ based on the initial modulated voltage $V_{AMP-L}$ and the modulated offset voltage $V_{OFF-L}$ ($V_{CC}=V_{AMP-L}+V_{OFF-L}$). When the voltage amplifier 44 is coupled to the second offset capacitor 64, the voltage amplifier 44 generates the second initial modulated voltage $V_{AMP-H}$ and the tracker circuit 48 provides the second modulated offset voltage $V_{OFF-H}$ across the second offset capacitor 64. Accordingly, the ET voltage circuit 40 generates the modulated voltage $V_{CC}$ based on the second initial modulated voltage $V_{AMP-H}$ and the second modulated offset voltage $V_{OFF-H}$ ($V_{CC}=V_{AMP-H}+V_{OFF-H}$).

Those skilled in the art will recognize improvements and modifications to the preferred embodiments of the present disclosure. All such improvements and modifications are considered within the scope of the concepts disclosed herein and the claims that follow.

What is claimed is:

1. A multi-bandwidth envelope tracking (ET) integrated circuit (IC) (ETIC) comprising:
   an ET voltage circuit configured to generate a modulated voltage based on a supply voltage, the ET voltage circuit comprising:
   a voltage amplifier configured to generate an initial modulated voltage based on a modulated target voltage and the supply voltage; and
   an offset capacitor configured to raise the initial modulated voltage by a modulated offset voltage to generate the modulated voltage; and
   a control circuit configured to:
   determine that the modulated voltage is required to transition from a first voltage level to a second voltage level; and
   adjust the supply voltage to cause the ET voltage circuit to change the modulated voltage from the first voltage level to the second voltage level by a determined voltage change time.

2. The multi-bandwidth ETIC of claim 1 wherein the control circuit is further configured to:
   determine that the modulated voltage is required to transition from the first voltage level in a first orthogonal frequency division multiplex (OFDM) symbol to the second voltage level in a second OFDM symbol immediately succeeding the first OFDM symbol and separated from the first OFDM symbol by a cyclic prefix; and
   adjust the supply voltage to cause the ET voltage circuit to change the modulated voltage from the first voltage level to the second voltage level by an end of the cyclic prefix.

3. The multi-bandwidth ETIC of claim 1 further comprising a tracker circuit configured to generate the modulated offset voltage across the offset capacitor.

4. The multi-bandwidth ETIC of claim 3 wherein the tracker circuit comprises:
   a multi-level charge pump (MCP) configured to generate the modulated offset voltage based on a battery voltage; and
   a power inductor configured to induce a low-frequency current based on the modulated offset voltage.

5. The multi-bandwidth ETIC of claim 3 wherein the control circuit is further configured to:
   receive the modulated target voltage;
   determine that the modulated voltage is required to transition from the first voltage level to the second voltage level based on a change in the modulated target voltage;
   cause the tracker circuit to change the modulated offset voltage across the offset capacitor from a first offset voltage level corresponding to the first voltage level to a second offset voltage level corresponding to the second voltage level based on the change in the modulated target voltage; and
   increase the supply voltage to cause the ET voltage circuit to change the modulated voltage from the first voltage level to the second voltage level by the determined voltage change time.

6. The multi-bandwidth ETIC of claim 5 wherein the control circuit is further configured to:
   determine that the modulated voltage is required to increase from the first voltage level to the second voltage level based on an increase of the modulated target voltage;
   cause the tracker circuit to increase the modulated offset voltage from the first offset voltage level to the second offset voltage level, wherein the modulated offset voltage reaches the second offset voltage level after the determined voltage change time; and
   increase the supply voltage to cause the voltage amplifier to increase the initial modulated voltage such that the modulated voltage can reach the second voltage level by the determined voltage change time.

7. The multi-bandwidth ETIC of claim 6 wherein the control circuit is further configured to decrease the supply voltage to cause the voltage amplifier to decrease the initial modulated voltage in response to the modulated offset voltage reaching the second offset voltage level.

8. The multi-bandwidth ETIC of claim 5 wherein the control circuit is further configured to:
   determine that the modulated voltage is required to decrease from the first voltage level to the second voltage level based on a decrease of the modulated target voltage;
   cause the tracker circuit to start decreasing the modulated offset voltage from the first offset voltage level to the second offset voltage level before the ET voltage circuit starts to decrease the modulated voltage from the first voltage level toward the second voltage level; and
   increase the supply voltage to cause the voltage amplifier to increase the initial modulated voltage such that the ET voltage circuit can maintain the modulated voltage at the first voltage level while the tracker circuit decreases the modulated offset voltage toward the second offset voltage level.

9. The multi-bandwidth ETIC of claim 8 wherein the control circuit is further configured to decrease the supply voltage at the determined voltage change time.

10. The multi-bandwidth ETIC of claim 3 further comprising a second ET voltage circuit configured to generate the modulated voltage based on the supply voltage, wherein the second ET voltage circuit comprises:
    a second voltage amplifier configured to generate a second initial modulated voltage based on the modulated target voltage and the supply voltage; and
    a second offset capacitor configured to raise the second initial modulated voltage by a second modulated offset voltage to generate the modulated voltage, wherein the second offset capacitor corresponds to a respective capacitance that is substantially larger than a respective capacitance of the offset capacitor.

11. The multi-bandwidth ETIC of claim 10 further comprising an output port coupled to an amplifier circuit configured to amplify a radio frequency (RF) signal based on the modulated voltage.

12. The multi-bandwidth ETIC of claim 11 wherein the control circuit is further configured to:
    activate the ET voltage circuit and deactivate the second ET voltage circuit when the RF signal is modulated in a first modulation bandwidth; and
    deactivate the ET voltage circuit and activate the second ET voltage circuit when the RF signal is modulated in a second modulation bandwidth lower than the first modulation bandwidth.

13. The multi-bandwidth ETIC of claim 12 wherein the control circuit is further configured to deactivate the voltage amplifier and the second voltage amplifier and activate the offset capacitor when the RF signal is modulated in a third modulation bandwidth lower than the second modulation bandwidth.

14. The multi-bandwidth ETIC of claim 13 wherein the control circuit is further configured to deactivate the ET voltage circuit and the second voltage amplifier and activate the second offset capacitor when the RF signal is modulated in a fourth modulation bandwidth lower than the third modulation bandwidth.

15. The multi-bandwidth ETIC of claim 14 wherein the control circuit is further configured to deactivate the ET voltage circuit and the second ET voltage circuit such that the tracker circuit can generate the modulated voltage as an average power tracking (APT) voltage.

16. The multi-bandwidth ETIC of claim 3 further comprising a second ET voltage circuit configured to generate the modulated voltage based on the supply voltage, wherein the second ET voltage circuit comprises:
    the voltage amplifier configured to generate a second initial modulated voltage based on the modulated target voltage and the supply voltage; and
    a second offset capacitor configured to raise the second initial modulated voltage by a second modulated offset voltage to generate the modulated voltage, wherein the second offset capacitor corresponds to a respective capacitance that is substantially larger than a respective capacitance of the offset capacitor.

17. The multi-bandwidth ETIC of claim 1 further comprising a supply voltage circuit configured to generate a higher supply voltage and a lower supply voltage, wherein the control circuit is further configured to:
    decrease the supply voltage of the ET voltage circuit by coupling the lower supply voltage to the voltage amplifier; and
    increase the supply voltage of the ET voltage circuit by coupling the higher supply voltage to the voltage amplifier.

18. The multi-bandwidth ETIC of claim 17 wherein the control circuit is further configured to couple the lower supply voltage and the higher supply voltage to a pair of output stages in the voltage amplifier.

19. The multi-bandwidth ETIC of claim 17 further comprising a switching circuit coupled between the supply voltage circuit and the voltage amplifier, wherein the control circuit is further configured to control the switching circuit to selectively couple the lower supply voltage or the higher supply voltage to a single output stage in the voltage amplifier.

* * * * *

UNITED STATES PATENT AND TRADEMARK OFFICE
CERTIFICATE OF CORRECTION

PATENT NO. : 11,424,719 B2
APPLICATION NO. : 16/597952
DATED : August 23, 2022
INVENTOR(S) : Nadim Khlat Page 1 of 1

It is certified that error appears in the above-identified patent and that said Letters Patent is hereby corrected as shown below:

In the Specification

Column 6, Line 18, replace "(e.g., >1 MHz and 200 MHz)" with --(e.g., >1 MHz and ≤200 MHz)--.
Column 6, Line 19, replace "(e.g., >120 KHz and 1 MHz)" with --(e.g., >120 KHz and ≤1 MHz)--.
Column 6, Line 20, replace "(e.g., 120 KHz)" with --(e.g., ≤120 KHz)--.
Column 10, Lines 3-4, replace "(e.g., >1 MHz and 200 MHz)" with --(e.g., >1 MHz and ≤200 MHz)--.
Column 10, Line 48-49, replace "(e.g., >120 KHz and 1 MHz)" with --(e.g., >120 KHz and ≤1 MHz)--.
Column 10, Lines 66-67, replace "(e.g., 120 KHz)" with --(e.g., ≤120 KHz)--.

Signed and Sealed this
Twenty-fifth Day of October, 2022

Katherine Kelly Vidal
*Director of the United States Patent and Trademark Office*